United States Patent [19]

Colussi

[11] 4,213,141
[45] Jul. 15, 1980

[54] HYBRID TRANSISTOR
[75] Inventor: Elio J. Colussi, Ambler, Pa.
[73] Assignee: Solid State Scientific Inc.
[21] Appl. No.: 905,213
[22] Filed: May 12, 1978
[51] Int. Cl.² .................. H01L 23/02; H01L 23/12; H01L 39/02
[52] U.S. Cl. ............................ 357/74; 357/80; 357/81; 333/247
[58] Field of Search ................ 357/74, 80, 81; 333/84 M, 247

[56] References Cited
U.S. PATENT DOCUMENTS

| | | | |
|---|---|---|---|
| 3,387,190 | 6/1968 | Winkler | 357/80 |
| 3,486,082 | 12/1969 | Sakamoto | 357/74 |
| 3,713,006 | 1/1973 | Litty et al. | 357/74 |
| 3,958,195 | 5/1976 | Johnson | 357/80 |
| 4,107,728 | 8/1978 | Max | 357/80 |

*Primary Examiner*—Andrew J. James
*Attorney, Agent, or Firm*—Frailey & Ratner

[57] ABSTRACT

A semiconductor device which provides in an input circuit a substantially low reactance and a relatively high resistance within a range of operating frequencies to improve the impedance match between the device and an energy source. The device has a semiconductor die with at least a first and a second bonding terminal having capacitance and resistance between the bonding terminals. At least a first bond lead electrically connects the first bonding terminal to a first metallic contact area. Means connects at least a second bond lead between the second bonding terminal and a second metallic contact area. At least a third bond lead electrically connects the first bonding terminal to the second metallic contact area to form an inductance to interact with the capacitance of the semiconductor die within the operating range of frequencies thereby to increase the input impedance.

11 Claims, 6 Drawing Figures

IMMITTANCE CHART

——  —  — ADMITTANCE
——————— IMPEDANCE

HYBRID TRANSISTOR

BACKGROUND OF THE INVENTION

A. Field of the Invention

The present invention relates generally to the field of semiconductor devices and more specifically to high frequency devices designed to operate at medium and high RF power levels.

B. Prior Art

Modern technology has increased the demand for semiconductor devices which are capable of providing a high power output at high radio frequencies, HF through UHF. However, it is well known that as the output power level of high frequency power transistors increases, the impedance at the input terminals of the power transistor decreases. This has necessitated the use of impedance transforming networks between the power transistor and the source of RF energy, i.e. and RF generator or the collector circuit of another power transistor. Impedance transforming is desirable because it results in the maximum amount of power transferred from the energy source to the power transistor. Since the energy source generally has an output impedance of about 50 ohms, the power transistor input impedance should be matched for maximum power to be transferred from the source to the power transistor.

It is well known that for frequencies up to approximately 100 MHz, matching networks external to the power transistor are used for impedance transformation. However, at operating frequencies above this, the parasitic effects of the bond wires become substantial, and must be included in the overall impedance transforming network. This requires that a portion of the matching network be included within the transistor package. Microwave techniques for impedance transformation within the package of the power transistor have been shown in U.S. Pat. No. 3,713,006 which describes an input transforming network, and U.S. Pat. No. 3,969,752 which describes an output compensating network.

The prior art shown in U.S. Pat. No. 3,713,006 includes the insertion of a MOS capacitor next to the transistor die within the package. The MOS capacitor forms a matching network in conjunction with the inductance created by the base bond wires or leads which connect the base metallic conductor or lead of the package with the base bonding terminals of the transistor die. This inductance-capacitance combination transforms the input impedance from a low impedance to a higher impedance. In this way, the prior art accomplishes an increase in the input impedance of the power transistor.

A limitation of the prior art method of increasing input impedance has been that it requires the addition of a MOS capacitor onto the transistor header which substantially increases not only the package fabrication time but the package fabrication cost.

An object of the present invention is to provide transformation by the use of bond wires acting as shunt inductances.

SUMMARY OF THE INVENTION

A semiconductor device which provides in an input circuit a substantially low reactance and a relatively high resistance within a range of operating frequencies to improve the impedance match between the device and an energy source. The device has disposed on a body member, an input and an additional metallic contact area in electrically insulated and spaced relationship with each other. A semiconductor die is also disposed on the body member and has at least an input and a common bonding terminal having capacitance and resistance between the bonding terminals. At least a first bond lead electrically connects an input bonding terminal to an input metallic contact area. Means connects at least a common bond lead between the second bonding terminal and the additional metallic contact area. At least a third bond lead electrically connects the input bonding terminal to the additional metallic contact area to form an inductance which interacts with the capacitance of the semiconductor die within the operating range of frequencies thereby to increase the input impedance.

DETAILED DESCRIPTION

Figure 1:
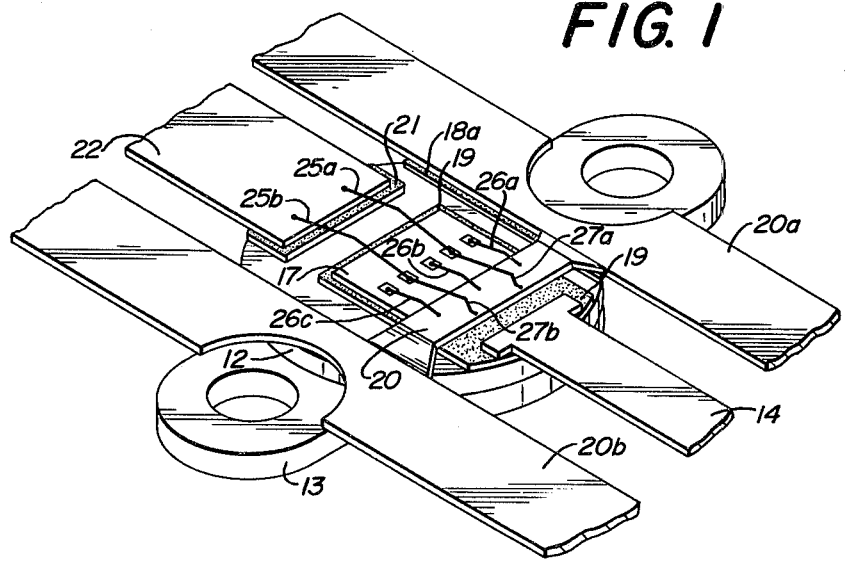
FIG. 1 is a perspective view of one of the embodiments of the invention.
Figure 2:
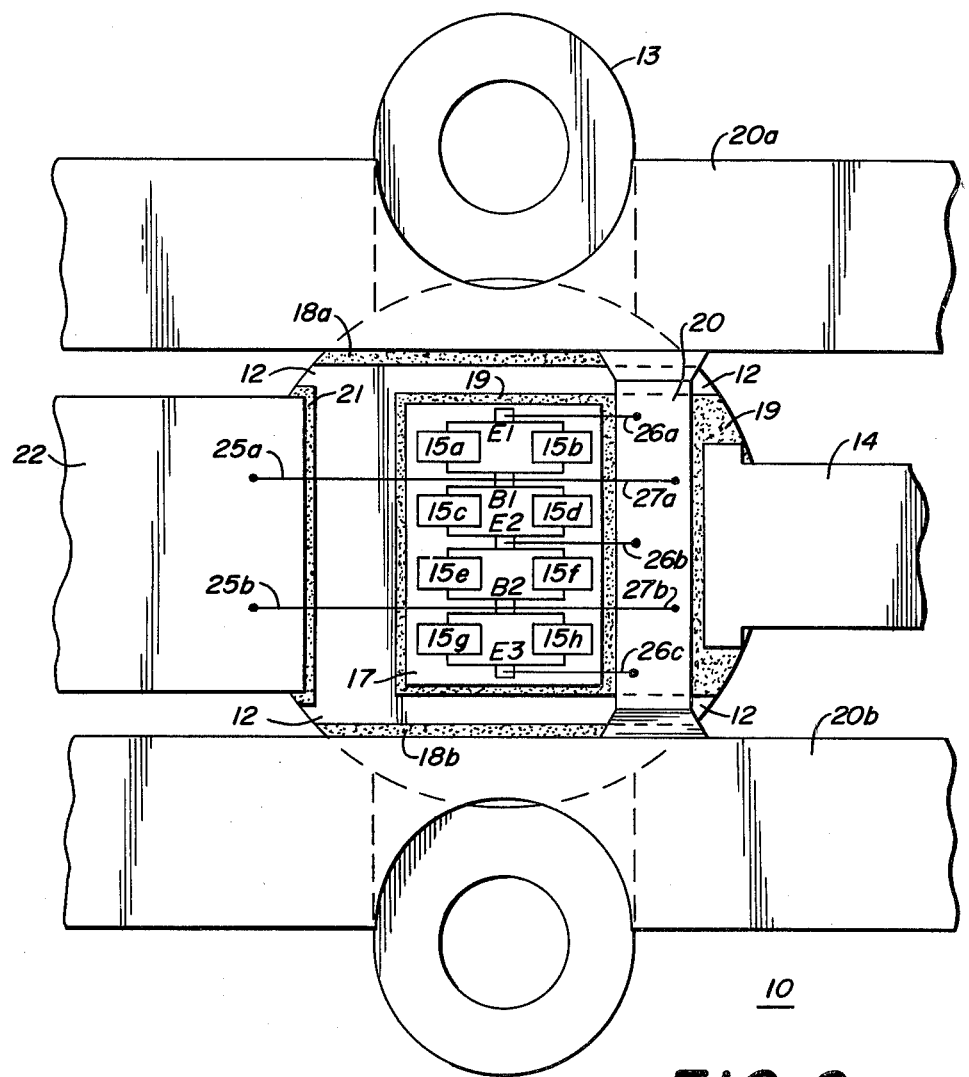
FIG. 2 is a top plain view of the hybrid transistor package.

Transistor 10 as shown in perspective in FIG. 1 and in greater detail in FIG. 2, comprises a metallic mounting flange 13 which supports a thermally conducting beryllium oxide ceramic header 12. The header functions as an electrically insulating body member which is partially covered by a first metallization 19 which is known as the collector pad and serves as the mounting pad for transistor die 17 and collector metallic conductor or lead 14. Header 12 is also covered by second metallization areas 18$a,b$ which support the emitter metallic conductors or leads 20$a$, 20$b$.

Leads 20$a$ and 20$b$ are also electrically connected by an emitter bridge 20 which is effective to provide a low impedance connection for the base and emitter bonding wires from transistor die 17 while simultaneously providing electrical isolation from first metallization 19 and collector metallic lead 14. A third metallization area 21 supports base metallic conductor or lead 22. It will be understood that FIGS. 1 and 2 show a common emitter configuration though a common base connection may also be provided with leads 20$a,b$ then becoming the base and lead 22 then becoming the emitter.

In the embodiment illustrated in FIG. 2, transistor die 17 comprises a plurality of eight transistor cells 15$a$–$h$, base bonding terminals or pads $B_1$ and $B_2$ and emitter bonding terminals or pads $E_1$, $E_2$, and $E_3$. It is understood that the present invention could be embodied in a transistor having any number of transistor cells, base bonding pads and emitter bonding pads. Base bonding pads $B_1$ and $B_2$ are connected to base metallic lead 22 by base bond leads or wires 25$a$ and 25$b$ respectively, and to emitter bridge 20 by base bond wires 27$a$ and 27$b$, respectively. The emitter bonding pads $E_1$, $E_2$ and $E_3$ are connected to the emitter bridge 20 by emitter bond wires 26a, 26b and 26c, respectively. While a transistor is defined as all of the elements in each of FIGS. 1 and 2, it will be understood that a transistor "package" may be defined as mounting flange 13, beryllium oxide header 12 and the combination of the leads or lead frame comprising leads 20a,b emitter bridge 20, base 22 and collector 14.

Figure 3:
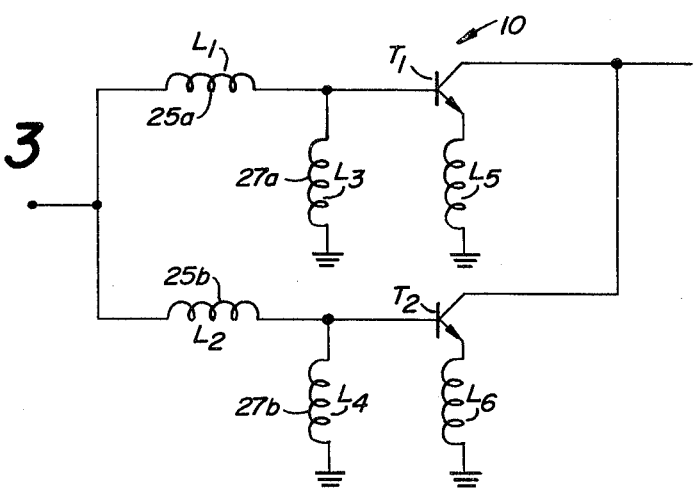
FIG. 3 is a schematic representation of the hybrid transistor.

FIG. 3 is a schematic illustration of a common emitter configuration of transistor 10 of FIG. 2 in which the inductance of base bond wires 25a, 25b and 27a and 27b are represented by inductors $L_1$, $L_2$, $L_3$ and $L_4$, respectively. Similarly, the combined inductance of emitter bond wires 26a and a portion of 26b is represented by $L_5$ and the combined inductance of emitter bond wires 26c and the remaining portion of 26b is represented by $L_6$. It is understood that schematic inductors $L_{1-6}$ of FIG. 3 do not represent actual coils of wire but rather the inductors represent the effective inductances which are formed by the relatively short lengths of base or emitter bond wires operating at very high or microwave frequencies. At these frequencies it is the sections of bond wire themselves, albeit of very short lengths, which give rise to the effective inductances shown in FIG. 3. Transistor cells 15a-d of FIG. 2 are represented by composite transistor $T_1$ in FIG. 3 and transistor cells 15e-h are represented by composite transistor $T_2$ in FIG. 3.

Figure 4:
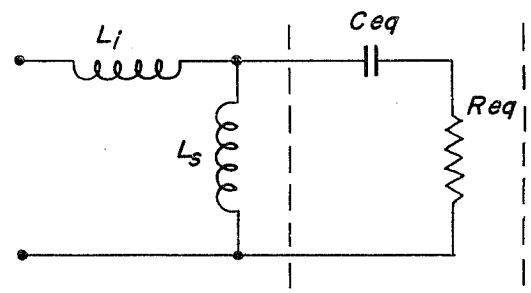
FIG. 4 is an equivalent circuit of the hybrid transistor illustrated in FIG. 1 showing the die parasitic capacitance and the shunt inductance.
Figure 5:
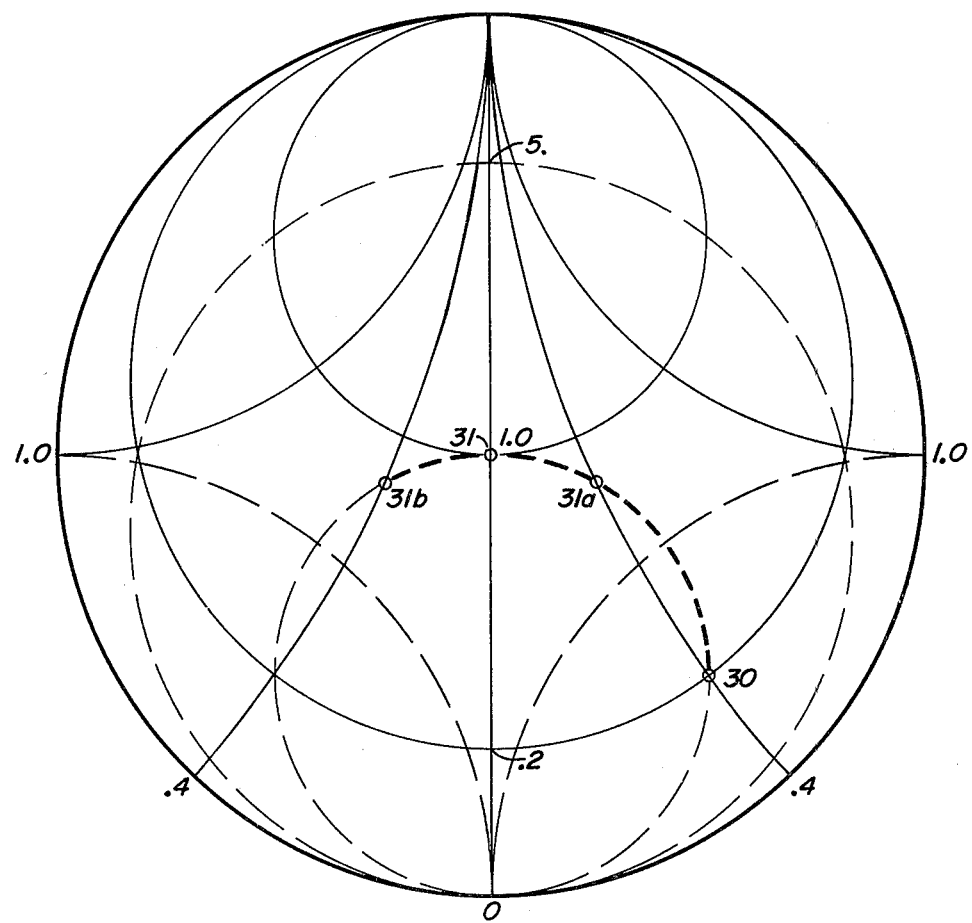
FIG. 5 is a Smith chart representation of the die impedances.

The input of transistor 10 of FIG. 2 may also be represented by an equivalent circuit as illustrated in FIG. 4. The combination of base bond wires 25a and 25b may be lumped together to form input inductor $L_i$. Similarly, the bond wires 27a and 27b may be lumped together to form shunt inductor $L_s$. The combination of the capacitance and input base resistance of the transistor cells on the die is represented by the equivalent circuit components $C_{eq}$ and $R_{eq}$. The impedance of the resistance capacitance combination formed by die parameters $R_{eq}$ and $C_{eq}$ is indicated by point 30 on the Smith Chart (Immittance chart) shown in FIG. 5. The Smith Chart is normalized for a 1.0 ohm impedance so that a pure 1.0 ohm resistance would be located at its center. It is understood that point 30 on the Smith Chart represents the series impedance of the die and consists of both resistance and capacitive reactance.

It is desired to transform the resistive and reactive impedance of die 17 to a value having a higher resistive component and a reduced or eliminated reactive component. This transformation is accomplished by connecting "shunt" base bond wires 27a and 27b from base bonding pads $B_1$ and $B_2$, respectively to emitter bridge 20. The base bond wires form the equivalent inductance $L_s$ of FIG. 4. This causes a shift in the impedance of die 17 from that represented by point 30 of the Smith Chart of FIG. 5 to that represented by point 31 on the Smith Chart. Point 30 represents the impedance of $C_{eq}$ and $R_{eq}$ of FIG. 4 alone while point 31 represents the impedance of $C_{eq}$, $R_{eq}$ and $L_s$ of FIG. 4.

The Smith Chart reflects the fact that the net effect of the addition of base bond wires 27a and 27b to die 17 is to raise the resistive component of the die impedance. It will be understood that the transformation may not actually reach point 31 in a typical commercial embodiment. Thus, for example, point 31a may be reached in which the resistive component has been raised and there is some effective capacitive reactance. On the other hand, point 31b may be reached in which the resistive component has been raised and there is some effective inductive reactance. As understood by those skilled in the art, points 31a or 31b may be preferable for the next step of impedance transformation.

It will further be understood that this impedance transformation within the package of the transistor 10 does not attain the total real value required by the driving source, normally about 50 ohms purely resistive, but is in the direction to achieve that real value of resistance.

In a typical embodiment of the invention at an operating frequency $f_o$—500 MHz, the impedance Z of the transistor die 17 as represented by the equivalent circuit components $C_{eq}$ and $R_{eq}$ in FIG. 4 would be as follows.

$$Z = R_{eq} + 1/(j2\pi f_o C_{eq}) \qquad (1)$$

$$Z \simeq 0.2 - j0.4 \qquad (2)$$

As equation (2) indicates, the die has a series equivalent resistance of 0.2 ohms and a series equivalent capacitive reactance of 0.4 ohms. The shunt inductance formed by the base bond wire 27a and 27b of FIGS. 1 and 2 indicated by equivalent inductance $L_s$ in FIG. 4 is approximately 0.16 nano-henry. This value of inductance results in an increase of the real part of the die input impedance and a cancellation in the reactive part of the die input impedance. At that frequency, the impedance of the combination of $L_s$, $C_{eq}$ and $R_{eq}$ of FIG. 5 at point 31 is as follows:

$$Z \simeq 1.0 + j0.0 \qquad (3)$$

Thus, it can be seen that the insertion of the shunt base bond wires 27a and 27b of FIGS. 1 and 2 into a typical embodiment of the invention is effective to raise the real part of the input impedance by a factor of 5 while simultaneously reducing the reactance to zero. The die impedance without inductor $L_s$ is indicated by point 30 on the Smith Chart shown in FIG. 5 while the die impedance with the addition of the shunt inductor $L_s$ is shown by point 31 on the Smith Chart.

Thus, it will now be understood that power transistor device 10 generally comprises a transistor die 17 and an auxiliary set of base bond wires 27a and 27b which connect the base bonding pads $B_1$ and $B_2$ of the die 17 to the emitter bridge 20 of the device 10. This auxiliary set of base bond wires 27a and 27 b is in addition to the normal set of base bond wires 25a and 25b which connect the base bonding pads $B_1$ and $B_2$ of the die 17 with the base metallic lead 22 of the package. At the frequency of operation, the set of shunt base bond wires 27a and 27b act as shunt inductors from the base to the emitter of the power transistor 10. The impedance transformation allows an impoved impedance match with the energy source which results in more power transferred from the energy source to the power transistor 10. It will further be understood that this increase in input power is transferred to the transistor without the disadvantages of increased transistor fabrication time, complexity and expense found in the prior art.

The several embodiments of the invention each have in addition to a higher input impedance an improved bandwidth capability. In addition to higher input impedance, laboratory measurements show other advantages that may be obtained are increased power gain, higher collector efficiency and improved stability.

As previously described, base bonding wires 27a and 27b act as inductors and the value of the total inductance formed is a function of the length, the diameter, the number, the spacing and the shape of the respective base bond wires. It will be understood that for the same die as the number of bond wires increases, the inter bond wire distance is reduced and the effective inductance decreases as a function of the total bond wire geometry and the mutual inductance between the bond wires. In addition, the total inductance is also determined by the inter bond wire spacing of emitter bond wires 26a, 26b and 26c and base bond wires 27a,b. FIG. 1 and 2 have been shown with a minimum number of bond wires 25a,b, 26a–c and 27a,b for the purposes of simplification of explanation. It will be understood, however, that a typical transistor 10 may have any number of bond wires.

Figure 6:
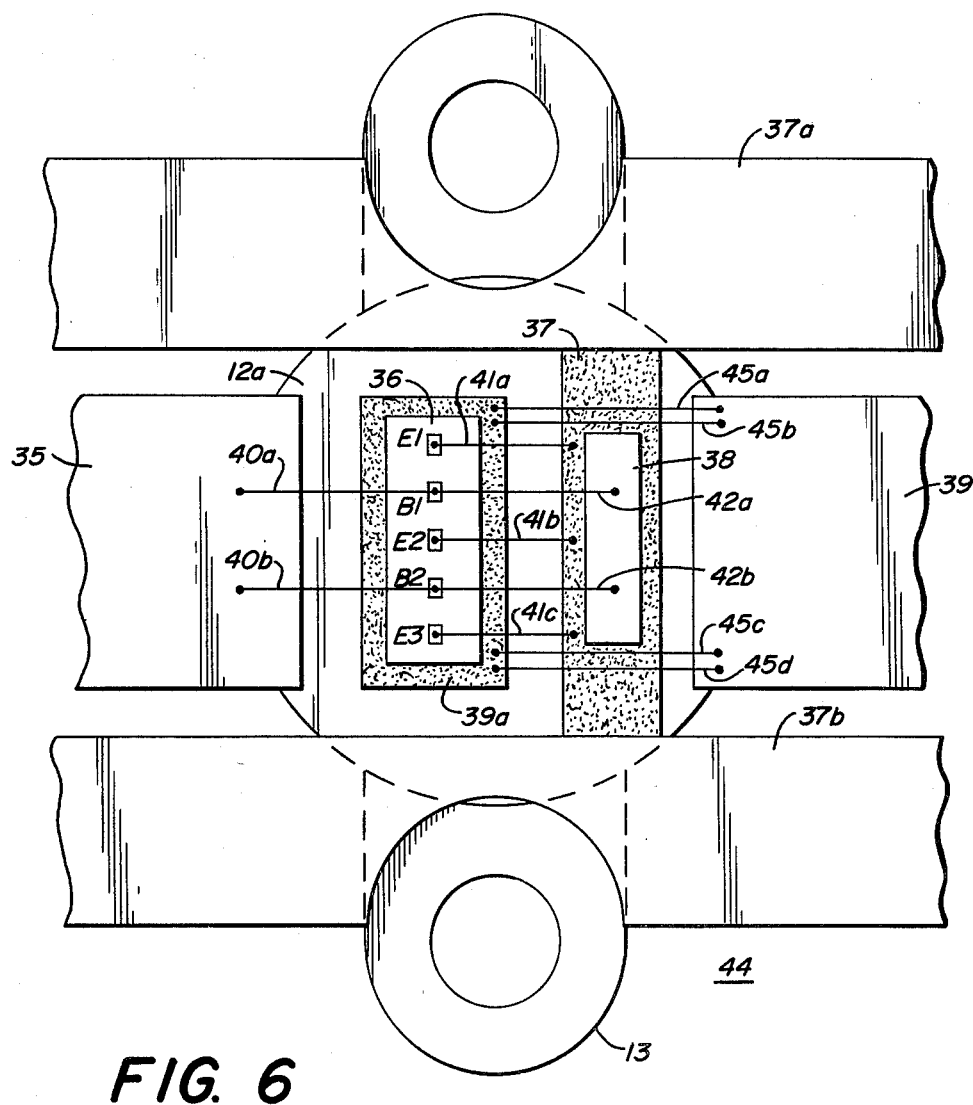
FIG. 6 is a top plain view of the hybrid transistor package with MOS D.C. blocking capacitor.

The transistor configuration shown in both FIG. 3 and FIG. 4 necessitates operation of the power transistor without a fixed DC bias on the base or in what is known as class C operation. If another form of operation such as class A, AB or B is desired, then a further embodiment of the invention can be formed by inserting a DC blocking capacitor in series with the shunt base bond wires. FIG. 6 shows a power transistor 44 having a mounting flange 13 supporting a header 12a with a MOS capacitor 38 used to form the DC blocking capacitor. In this embodiment of the invention, the base bond wires 42b and 42b are bonded to the top contact area of MOS capacitor 38 instead of directly to an emitter bridge 20 as shown in FIGS. 1 and 2. MOS capacitor 38 represents a low impedance at the operating frequency. It should be understood that the MOS capacitor 38 as used in this embodiment serves primarily as a DC blocking capacitance and as such does not function as a primary component of the impedance matching circuit.

Since the embodiment of FIG. 6 does not include the emitter bridge 20 shown in FIGS. 1 and 2, an emitter strip 37 (between leads 37a,b) is provided to form an electrically conducting connection terminal for emitter bond wires 41a, 41b and 41c. Also, the electrically conducting metallization 19 of FIG. 2 which connected the transistor die 17 with collector lead 14 is not included in this embodiment of the invention. There are provided collector bond wires 45a–d as shown in FIG. 6 to electrically connect metallization 39a with the collector lead 39. Base lead 35 is connected to the base bonding pads B₁ and B₂ by base bond wires 40a and 40b as in FIGS. 1 and 2. It will be understood that shunt base bond wires 42a and 42b used in the embodiment of the invention shown in FIG. 6 interact with the capacitance of die 36 of FIG. 6 in the same way as shunt base bond wires 27a and 27b interact with the capacitance of die 17 of FIGS. 1 and 2.

In a further embodiment, MOS capacitor 38 may be mounted directly on top of an emitter bridge 20 of the type shown in FIGS. 1 and 2 rather than mounted in the manner shown in FIG. 6. It will be understood that capacitor 38 may be a capacitor device other than MOS such as a ceramic capacitor, for example. While FIGS. 1 and 2 and 6 effectively refer to bipolar transistors, it will be understood that other semiconductor devices may be used such as FET's.

I claim:

1. A semiconductor device to provide in an input circuit a substantially low reactance and a relatively high resistance within a range of operating frequencies to improve the impedance match between the semiconductor device and an energy source comprising
an electrically insulating body member, said body member having disposed thereon an input and an additional metallic contact area in an electrically insulated and spaced relationship with each other,
a semiconductor die disposed on the body member and having at least an input and a common bonding terminal having capacitance and resistance between said bonding terminals,
at least a first bond lead electrically connecting said input bonding terminal to said input metallic contact area,
means connecting at least a second bond lead between said common bonding terminal and said additional metallic contact area, and
at least a third bond lead electrically connecting said input bonding terminal to said additional metallic contact area forming an inductance to interact with said capacitance of said semiconductor die within the operating range of frequencies for increasing the input impedance.

2. The semiconductor device of claim 1 in which said at least input and common bonding terminals comprise respectively sets of input common bonding terminals having capacitance and resistance between said sets of bonding terminals.

3. The semiconductor device of claim 2 in which said at least a first bond lead comprises a set of first bond leads electrically connecting said set of input bonding terminals to said input metallic contact area.

4. The semiconductor device of claim 3 in which said at least a second bond lead comprises a set of second bond leads, said connecting means couples at least said set of common bond leads between said set of second bonding terminals and said additional metallic contact area.

5. The semiconductor device of claim 4 in which said at least a third bond lead comprises a set of third bond leads electrically connecting said set of input bonding terminals to said additional metallic contact area.

6. The semiconductor device of claim 1 in which semiconductor die comprises an RF power transistor die.

7. The semiconductor device of claim 6 in which there is provided a further metallic contact area in electrically insulated and spaced relationship with said input and additional metallic contact areas, said transistor die having a third bonding terminal coupled to said third metallic contact area.

8. The semiconductor device of claim 1 in which said connecting means includes a direct connection between said second bond lead and said additional metallic contact area.

9. The semiconductor device of claim 1 in which said connecting means includes a capacitor having a first capacitor contact area forming said additional metallic contact area and having a second capacitor contact area directly coupled to said second bond lead.

10. The semiconductor device of claim 7 in which said input, additional and further metallic contact areas are respectively base, emitter and collector contact areas and said input and common bonding terminals are respectively said base and emitter bonding terminals.

11. The method of making a semiconductor device having a body member and having in an input circuit a substantially low reactance and a relatively high resistance within a range of operating frequencies to improve the impedance match between the semiconductor device and an energy source which comprises the steps of (a) disposing on the body member an input and an additional metallic contact area in an electrically insulated spaced relationship with each other, (b) positioning a semiconductor die on the body member having at least an input and a common bonding terminal with capacitance and resistance between the bonding terminals, (c) electrically connecting at least a first bond connector between the input bonding terminal and the input metallic contact area, (d) electrically connecting at least a second bond connector between the common bonding terminal and the additional metallic contact area, and (e) electrically connecting the input and additional bonding terminals forming an inductance to interact with the capacitance of the semiconductor die within the operating range of frequencies for increasing the input impedance.

* * * * *